United States Patent [19]

Huenig et al.

[11] Patent Number: 4,885,368
[45] Date of Patent: Dec. 5, 1989

[54] RADICAL ION SALTS

[75] Inventors: Siegfried Huenig, Wuerzburg; Alexander Aumueller, Ludwigshafen; Peter Erk, Gerbrunn, all of Fed. Rep. of Germany

[73] Assignee: BASF Aktiengesellschaft, Ludwigshafen, Fed. Rep. of Germany

[21] Appl. No.: 125,823

[22] Filed: Nov. 23, 1987

Related U.S. Application Data

[63] Continuation of Ser. No. 876,399, Jun. 20, 1986, abandoned.

[30] Foreign Application Priority Data

Jun. 21, 1985 [DE] Fed. Rep. of Germany ....... 3522232

[51] Int. Cl.$^4$ ................. C07D 241/46; C07D 317/70; C07D 317/44; C07D 413/00
[52] U.S. Cl. .................... 544/347; 546/348; 546/152; 546/176; 546/181; 546/182; 546/139; 546/151; 549/433; 549/434; 549/435; 549/439; 556/110; 518/302
[58] Field of Search ............... 556/110; 546/348, 152, 546/176, 181, 181, 139, 151; 544/347; 549/433, 434, 435, 439; 558/302

[56] References Cited

U.S. PATENT DOCUMENTS

| | | | |
|---|---|---|---|
| 2,762,811 | 9/1956 | Middleton | 556/110 X |
| 2,779,780 | 1/1957 | Middleton | 556/110 X |
| 3,051,736 | 8/1962 | Horn | 556/110 |
| 3,644,453 | 2/1972 | Onsager | 556/110 |
| 3,711,527 | 1/1973 | Kurtz | 556/110 X |
| 4,578,220 | 3/1986 | Huenig et al. | 544/347 UX |

FOREIGN PATENT DOCUMENTS

3437814 5/1985 Fed. Rep. of Germany .

OTHER PUBLICATIONS

Chemical Abstracts vol. 101:38122f (1984).
Chemical Abstracts vol. 103:104661c (1985).
Chemical Abstracts vol. 103:141935r (1985).

*Primary Examiner*—Paul F. Shaver
*Attorney, Agent, or Firm*—Oblon, Spivak, McClelland, Maier & Neustadt

[57] ABSTRACT

Novel radical ion salts of the formula

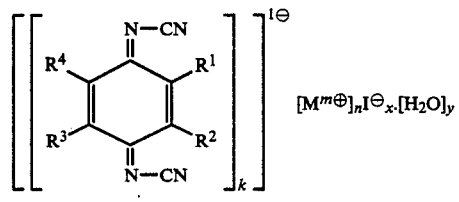

wherein $R^1$, $R^2$, $R^3$ and $R^4$ independently of one another are each hydrogen, methyl, ethyl, phenyl, methoxy, ethoxy, fluorine, chlorine or bromine, or $R^1$ or $R^1$ and $R^3$ may furthermore be tert-butyl and/or $R^1$ and $R^2$ and/or $R^3$ and $R^4$ together may in each case form a radical of the formula

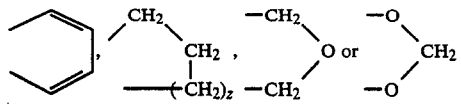

where z is 0, 1, 2 or 3, and the fused aromatic rings are unsubstituted or monosubstituted or disubstituted by chlorine, bromine, methyl and/or methoxy, $M^{m\oplus}$ is an m-valent alkali metal, alkaline earth metal, transition metal, tin, lead, thallium, ammonium, phosphonium, arsonium or stibonium ion, k is from 1 to 5, l is from 0.1 to 4, m is from 1 to 3, n is from 0.1 to 4, x is from 0 to 2 and y is from 0 to 6, and k, l, n, x and y may furthermore be non-integral numbers and $(l+x)=n.m$, are electrically conductive in the crystalline state. A number of the salts are stable at 300° C. and above.

The salts (I) are useful as electrical semiconductors and photoconductors, as electrode or storage material, in electric batteries, etc.

10 Claims, No Drawings

RADICAL ION SALTS

This application is a continuation of application Ser. No. 876,399, filed on June 20, 1986, now abandoned.

The present invention relates to novel radical ion salts based on N,N-dicyanoquinonediimines.

Radical ion salts of tetracyanoquinodimethanes and copper or silver are known [Appl. Phys. Lett. 34 (1979), 405, J. Amer. Chem. Soc. 102 (1980), 3659 and Chem. Skripta 17 (1981), 219].

The present invention relates to novel radical ion salts of biscyanimines of the formula

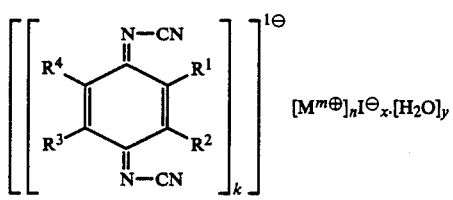

where $R^1$, $R^2$, $R^3$ and $R^4$ independently of one another are each hydrogen, methyl, ethyl, phenyl, methoxy, ethoxy, fluorine, chlorine or bromine and $R^1$ or $R^1$ and $R^3$ may furthermore be tert-butyl or $R^1$ and $R^2$ and/or $R^3$ and $R^4$ together may in each case form a radical of the formula

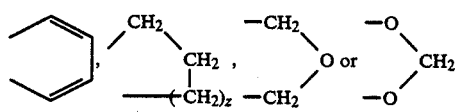

where z is 0, 1, 2 or 3 and the fused, aromatic rings are unsubstituted or monosubstituted or disubstituted by chlorine, bromine, methyl and/or methoxy, $M^{m\oplus}$ is an m-valent alkali metal, alkaline earth metal, transition metal, tin, lead, thallium, ammonium, phosphonium, arsonium or stibonium ion, k is from 1 to 5, l is from 0.1 to 4, m is from 1 to 3, n is from 0.1 to 4, x is from 0 to 2 and y is from 0 to 6, and k, l, n, x and y may furthermore be non-integral numbers and (l+x)=n.m.

In the microcrystalline state, the novel salts (I) (complexes) have a high electrical conductivity, which as a rule is clearly or substantially higher in single crystals. For example, the conductivities of the salts (I) are substantially superior to those of the known radical ion salts based on tetracyanoquinodimethane and copper or silver. Thus, the prior art TCNQ.Cu salt has a conductivity of 0.005 S.cm$^{-1}$ [L. R. Melby et al., J. Amer. Chem. Soc. 84 (1962), 3374], while the corresponding radical ion salt according to the invention (Example 37) has a conductivity of 0.02 S.cm$^{-1}$. A number of the compounds (I) are thermally stable at about 300° C. or above. Accordingly, the novel complexes are useful, for example, as electrical semiconductors and photoconductors, for the antistatic treatment of plastics, as electrode and storage material in electric batteries, for the production of solar cells, in fuel cells, for the conversion of radiation and for the production of electronic components. Microcrystalline films of the novel radical ion salts can be used for the production of bistable electrical switching elements.

Specific examples for combinations of $R^1$, $R^2$, $R^3$ and $R^4$ are as follows:

(a) $R^1$, $R^2$, $R^3$ and $R^4$ are identical and are each hydrogen, fluorine, chlorine, methyl or methoxy or (b) $R^1$ is chlorine, bromine, methyl, ethyl, methoxy, ethoxy, phenyl or tert-butyl and $R^2$, $R^3$ and $R^4$ are each hydrogen, or (c) $R^1$ and $R^4$ are identical and are each chlorine, methyl or methoxy and $R^2$ and $R^3$ are each hydrogen, or (d) $R^1$ and $R^2$ are identical and are each chlorine, methyl, methoxy or phenyl and $R^3$ and $R^4$ are each hydrogen, or (e) $R^1$ and $R^3$ are identical and are each chlorine, bromine, methyl, ethyl, methoxy, phenyl or tert-butyl and $R^2$ and $R^4$ are each hydrogen or (f) $R^1$, $R^2$ and $R^3$ are each methyl and $R^4$ is hydrogen, or (g) $R^1$ is methyl, $R^3$ is chlorine or bromine and $R^2$ and $R^4$ are each hydrogen, or (h) $R^1$ and $R^2$ together form a radical of the formula

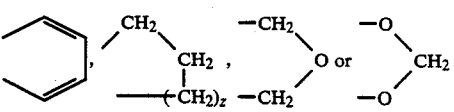

where z is 0, 1, 2 or 3 and the fused aromatic ring is unsubstituted or monosubstituted or disubstituted by chlorine, methyl and/or methoxy, and $R^3$ and $R^4$ independently of one another are each hydrogen, chlorine or methyl or (i) $R^1$ and $R^2$, and $R^3$ and $R^4$, in each case together form a radical of the formula

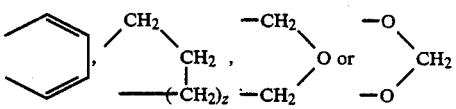

where z is 0, 1, 2 or 3 and the fused aromatic rings are unsubstituted or monosubstituted or disubstituted by chlorine, methyl and/or methoxy.

Suitable ions $M^{m\oplus}$ are ions of metals whose redox potential is less than or equal to that of silver, eg. ammonium, phosphonium, arsonium and stibonium.

Examples of metal ions are those of the alkali metals, such as lithium, sodium, potassium, rubidium and cesium, those of the alkaline earth metals, such as calcium, strontium and barium, those of the transition metals, such as chromium, manganese, iron, cobalt, nickel, copper, zinc, silver, cadmium and mercury, and those of tin, lead and thallium.

Examples of ammonium $M^{m\oplus}$ are tetra-$C_1$–$C_4$-alkylammonium, tetraphenyl-$C_1$–$C_3$-alkylammonium, phenyl-$C_1$–$C_3$-alkyl-tris-$C_1$–$C_4$-alkylammonium, $C_1$–$C_4$-alkylpyridinium, N-phenyl-$C_1$–$C_3$-alkylpyridinium, quinolinium, N-$C_1$–$C_4$-alkylquinolinium, N-phenyl-$C_1$–$C_3$-alkylquinolinium and the corresponding isoquinolinium compounds, phenazinium, N-$C_1$–$C_4$-alkylphenazinium and N-phenyl-$C_1$–$C_3$-alkylphenazinium.

Particularly suitable phosphonium, arsonium and stibonium ions are those which are derived from the triphenyl compounds.

Specific examples of $M^{m\oplus}$ are $Li^\oplus$, $Na^\oplus$, $K^\oplus$, $Rb^\oplus$, $Cs^\oplus$, $Mg^{2\oplus}$, $Ca^{2\oplus}$, $Ba^{2\oplus}$, $Sr^{2\oplus}$, $Cr^{3\oplus}$, $Mn^{2\oplus}$, $Fe^{2\oplus}$, $Fe^{3\oplus}$, $Co^{2\oplus}$, $Ni^{2\oplus}$, $Cu^\oplus$, $Cu^{2\oplus}$, $Zn^{2\oplus}$, $Ag^\oplus$, $Cd^{2\oplus}$, $Sn^{2\oplus}$, $Pb^{2\oplus}$, $Pb^{4\oplus}$, $Tl^\oplus$, $Tl^{3\oplus}$, triphenylmethylphosphonium, triphenylmethylarsonium, triphenylmethylstibonium, tetramethylammonium, tetraethylammonium, tetrapropylammonium, tetrabutylammonium, tetrabenzylammonium, tetra(2-phenylethyl)ammonium, trimethylbenzylammonium, triethylbenzylammonium, pyridinium, N-methyl- and N-ethylpyridinium, N-methyl-2-methylpyridinium, N-methyl-3-methylpyridinium, N-methyl-4-methylpyridinium, N-benzylpyridinium, quinolinium, N-methyl, N-ethyl- and N-benzylquinolinium, phenazinium and N-methyl-, N-ethyl- and N-benzylphenazinium.

Preferred $M^{m\oplus}$ ions are copper(I) and silver(I) ions, tetramethylammonium, tetraethylammonium, tetrabenzylammonium, trimethylbenzylammonium, triethylbenzylammonium, quinolinium, pyridinium, N-methylpyridinium, N-ethylquinolinium, N-methylquinolinium, phenazinium and N-methylphenazinium, of which copper (I), silver(I), pyridinium, N-methylpyridinium, quinolinium, N-methylquinolinium, phenazinium and N-methylphenazinium are particularly preferred.

The radical ion salts (I) according to the invention can be prepared by various processes. One route is the reaction of N,N'-dicyanoquinonediimines of the formula (II)

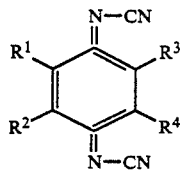

(II)

where $R^1$, $R^2$, $R^3$ and $R^4$ have the above meanings, with halides, preferably iodides, of the above cations $M^{m\oplus}$ in a molar ratio of from 1:0.5 to 1:3, in a solvent, if necessary at elevated temperatures. Examples of suitable solvents are dichloromethane, chloroform, tetrahydrofuran, 1,1,1-trichloroethane, acetonitrile, benzene, toluene, chlorobenzene and dichlorobenzene. The radical ion salts are isolated in a conventional manner by filtration under suction.

The novel radical ion salts (I) may furthermore be prepared by reacting an N,N'-dicyanoquinonediimine of the formula (II) with a metal M, preferably in powdered form, in a molar ratio of from 1:1 to 1:0.2, in one of the abovementioned solvents which is inert to the metal, if necessary at elevated temperatures. The radical ion salts are isolated in a conventional manner by filtration under suction.

The novel radical ion salts (I) may furthermore be prepared by electrolysis of a solution which contains an N,N'-dicyanoquinonediimine of the formula (II) and a salt containing one of the above cations ($M^{m\oplus}$) in one of the above solvents, at from room temperature to −30° C. The temperature depends on the solubility of the N,N'-dicyanoquinoneimine. Preferably, electrolysis is carried out at <0° C., in particular from −10° to −30° C., in order as far as possible to avoid any decomposition which may occur. In this case too, the radical ion salts are isolated in a conventional manner by filtration under suction. The yield of the radical ion salt (I) depends on the duration of electrolysis and on the solubility of (I) in the solvent used for the electrolysis, since isolation of the dissolved salt (I) from the electrolysis solution containing the conductive salt is very difficult.

The radical ion salts (I) according to the invention can also be prepared by reacting the lithium salt of an N,N'-dicyanoquinonediimine of the formula (II) with a salt containing one of the above cations ($M^{m\oplus}$) in a solvent such as methanol, ethanol, propanol, water, acetonitrile or a mixture of these.

Microcrystalline films which consist of the novel radical ion salts can be produced in a conventional manner by immersing a metallic body in a solution of an N,N'-dicyanoquinoneimine in one of the above solvents, preferably at elevated temperatures.

The Examples which follow illustrate the invention. Percentages for the yields are based on the theoretical yield. The stated conductivities are determined for powder pellets or single crystals.

EXAMPLE 1

A solution of 156 mg (100 millimoles) of N,N'-dicyano-1,4-benzoquinonediimine is added dropwise to a filtered solution of 1.34 g (10.0 ml) of lithium iodide in acetonitrile, while stirring. Stirring is continued for 10 minutes, after which the product is filtered off under suction and washed with acetonitrile to give 98 mg (52%) of the corresponding radical ion salt in the form of a pale violet powder which decomposes above 234° C.

Analysis: $C_8H_6I_{0.06}Li_{1.06}N_4O$. Calculated: C 50.81, H 3.20, I 4.03, N 29.64%. Found: C 51.43, H 3.19, I 3.93, N 28.98%.

EXAMPLES 2 TO 9

A solution of copper(I) iodide in acetonitrile is added to a solution of N,N'-dicyanoquinonediimine (II) in acetonitrile. During this procedure, a dark precipitate separates out and is filtered off under suction and washed with acetonitrile. The N,N'-dicyanoquinonediimines (II) used are characterized by the substituents in columns 2 to 5 of Table 1.

The radical anion salts obtained are of the general formula (Ia)

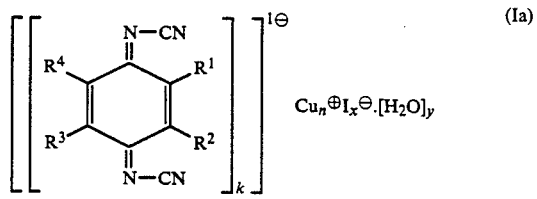

(Ia)

The meanings of k, l, n, x and y are given in columns 6 to 10 in Table 1. In the Table, the salts (Ia) are characterized by the decomposition point and elemental analysis.

TABLE 1

| Example | $R^1$ | $R^2$ | $R^3$ | $R^4$ | k | l | n | x | y | C [%] | H [%] | N [%] | Other elements | Decomposition point [°C.] | Yield [% of therory] | Conductivity $\sigma[S \cdot cm^{-1}]$ |
|---|---|---|---|---|---|---|---|---|---|---|---|---|---|---|---|---|
| 2 | H | H | H | H | 1 | 1 | 1 | 0 | 0 | 44.20 | 1.63 | 25.04 | Cu: 28.2 | from 265 | 75 | |
| 3 | CH3 | H | H | H | 1 | 1 | 1 | 0 | 0 | 45.81 | 2.69 | 23.45 | Cu: 25.2 | from 205 | 60 | |
| 4 | CH3 | CH3 | H | H | 1.3 | 1 | 1 | 0 | 0 | 51.47 | 3.59 | 23.83 | | from 205 | 51 | |
| 5 | CH3 | H | CH3 | H | 2 | 1 | 1 | 0 | 0 | 55.91 | 3.61 | 26.07 | | from 229 | 87 | |

TABLE 1-continued

| Example | R¹ | R² | R³ | R⁴ | k | l | n | x | y | C [%] | H [%] | N [%] | Other elements | Decomposition point [°C.] | Yield [% of therory] | Conductivity $\sigma$[S·cm$^{-1}$] |
|---|---|---|---|---|---|---|---|---|---|---|---|---|---|---|---|---|
| 6 | OCH₃ | H | OCH₃ | H | 3 | 2 | 2 | 0 | 0 | 46.78 | 3.09 | 21.96 | | from 280 | 78 | |
| 7 | Cl | H | Cl | H | 1.63 | 1 | 1 | 0 | 0 | 36.44 | 0.67 | 21.25 | | >350 | 46 | 2.5 |
| 8 | CH₃ | CH₃ | CH₃ | H | 1.75 | 0.91 | 1 | 0.09 | 0 | 54.91 | 4.19 | 23.27 | I: 2.81 | from 173 | 83 | |
| 9 | —(CH=CH)₂— | | H | H | 1.10 | 0.4 | 2 | 1.6 | 0 | 28.26 | 0.92 | 11.21 | I: 36.78 | >350 | 54 | 1.3·10⁻² |
| 10 | Cl | H | CH₃ | H | 2 | 1 | 1 | 0 | 0 | 42.47 | 1.81 | 21.42 | | >350 | 98 | 0.4 |
| 11 | —(CH=CH)₂— | | H | H | 5 | 4 | 4 | 0 | 0 | 55.23 | 3.82 | 21.40 | | >350 | 78 | |

EXAMPLE 12

The procedure described in Example 1 is followed, except that a solution of copper(I) bromide in tetrahydrofuran is used, and a solution of 2-chloro-5-methyl-N,N'-dicyano-1,4-benzoquinonediimine is added dropwise to this. The corresponding radical ion salt of the formula

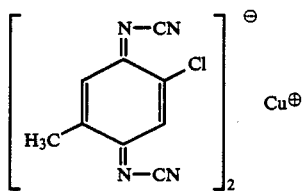

is obtained in a yield of 93%. Mp. >350° C.
C₉H₅N₄ClCu. Calculated: C 45.73, H 2.13, N 23.70%. Found: C 45.40, H 1.85, N 23.42%.
Conductivity: 0.4 S.cm⁻¹ (powder).

EXAMPLES 13 TO 15

N,N'-Dicyanoquinonediimines (II) are stirred with silver powder in acetonitrile at room temperature. Insoluble material is filtered off under suction. The N,N'-dicyanoquinonediimines (II) used are characterized by R¹ to R⁴ in columns 2 to 5 of Table 2.

The radical ion salts obtained are of the general formula (Ib)

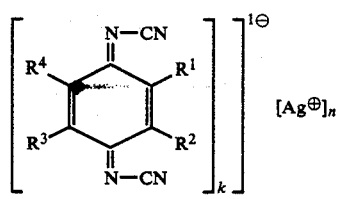

The meanings of k, n and y are given in columns 6 to 9.

In Table 2, the salts (Ib) are characterized by the decomposition point, elemental analysis and the electrical conductivity.

EXAMPLE 16

Electrolysis is carried out in a cell which holds 60 ml of liquid and is divided into 3 compartments by two G4 glass frits. Each compartment can be filled or emptied under protective gas, independently of one another.

The electrodes are present in the outer compartments. Dividing the cell into three parts prevents by-products formed at the anode from penetrating into the cathode space.

Two platinum sheets measuring 20×10×1 mm are used as the electrodes. The electrodes and the cell are cleaned with a mixture of 35% strength hydrogen peroxide and concentrated sulfuric acid each time before being used. They are then washed with water, after which the cell is steeped in distilled water for 1 day in order to remove final traces of acid. The cell is then dried at 120° C.

Current is supplied by a constant current source which can be regulated between 0 and 250 μA.

By adjusting the cell temperature in a heatable bath, electrolysis can be effected at defined temperatures.

To carry out the electrolysis, a solution of 92 mg (500 μmol) of N,N'-dicyano-2,5-dimethyl-1,4-benzoquinonediimine and 170 mg (=1.00 millimole) of silver nitrate in 60 ml of acetonitrile is introduced into all three compartments of the cell, and electrolysis is effected at room temperature, using a current of 3 μA. Thin acicular crystals up to 3 cm long grow at the cathode. After 80 hours, 12 mg (10%) of silver salt are isolated in the form of deep black needles of melting point 205° C. (decomposition).

Analysis (476.3): C₂₀H₁₆AgN₈. Calculated: C 50.43, H 3.39, N 23.53%. Found: C 50.42, H 3.29, N 22.91%.

Electrolysis of the solution is not taken to completion, in order to avoid excessive reduction.

EXAMPLE 17

A solution of 68 mg (=302 μmol) of N,N'-dicyano-2,5-dichloro-1,4-benzoquinonediimine and 368 mg (2.27 millimoles) of tetramethylammonium tetrafluoborate in acetonitrile is subjected to electrolysis at −25° C., using a current of 50 μA. After 40 hours, the black needles up to 2 mm long which are deposited at the cathode and exhibit metallic gloss are collected, and washed with diethyl ether. 20 mg (25%) of the radical salt of melting point 220° C. (decomposition) are obtained.

TABLE 2

| Example | R¹ | R² | R³ | R⁴ | k | n | C [%] | H [%] | N [%] | Decomposition point [°C.] | Conductivity $\sigma$[Scm⁻¹] |
|---|---|---|---|---|---|---|---|---|---|---|---|
| 13 | H | H | H | H | 1 | 1 | 36.41 | 1.32 | 20.86 | >350 | 1.7 19 10⁻² |
| 14 | Cl | H | Cl | H | 1.1 | 1 | 30.05 | 0.36 | 16.93 | >350 | 19.8 |
| 15 | H | H | Cl | H | 1.62 | 1 | 32.95 | 0.69 | 19.22 | >350 | 8·10⁻² |

Analysis (476.3): $C_{22}H_{16}AgN_9$. Calculated: C 45.82, H 3.00, N 24.05%. Found: C 46.37, H 3.10, N 23.95%.

EXAMPLES 18 TO 36

The N,N'-dicyanoquinonediimines (II) characterized in Table 3 by $R^1$, $R^2$, $R^3$ and $R^4$ are subjected to electrolysis together with salts containing cations $M^{m\oplus}$, in acetonitrile, using procedures similar to those described in Examples 15 and 16. Electrolysis is carried out at between room temperature (25° C.) and −20° to −25° C., depending on the solubility of the N,N'-dicyanoquinonediimines (II) used. The yield of (I) is dependent on the duration of electrolysis and on the solubility of the resulting compound (I) in acetonitrile. Isolation of the dissolved compound (I) from the acetonitrile solution formed during electrolysis and containing the conductive salt is very difficult.

Radical ion salts of the general formula (Ic) are obtained.

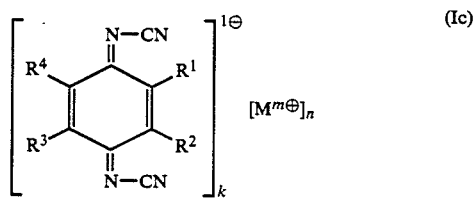

(Ic)

The meanings of k, $M^{m\oplus}$ and n are given in Table 3 (columns 6 to 8).

The salts (Ic) obtained are characterized in columns 9 to 12 by their decomposition points and elemental analysis, and in some cases by their conductivities.

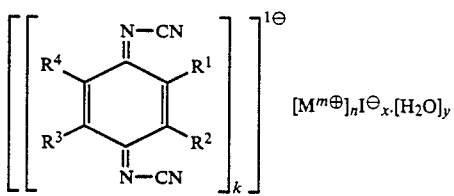

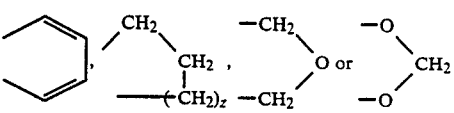

wherein $R^1$, $R^2$, $R^3$ and $R^4$ independently of one another are each hydrogen, methyl, ethyl, phenyl, methoxy, ethoxy, fluorine, chlorine or bromine; or $R^1$ or $R^1$ and $R^3$ are each tert-butyl; or $R^1$ and $R^2$ or $R^3$ and $R^4$ or $R^1$ and $R^2$ and $R^3$ and $R^4$ together form a radical of the formula:

wherein z is 0, 1, 2 or 3, and wherein the fused aromatic rings are substituted by chlorine, bromine, methyl or methoxy, $M^{m+}$ is a cation whose redox potential is less than or equal to that of silver and which is selected from the group consisting of m-valent alkali metals, copper, silver and tetra-$C_1$-$C_4$-alkyl ammonium, tetraphenyl-$C_1$-$C_3$-alkyl ammonium, phenyl-$C_1$-$C_3$-alkyl-tris-$C_1$-$C_4$-alkyl ammonium, $C_1$-$C_4$-alkylpyridinium, N-(phenyl-$C_1$-$C_3$-alkyl)-pyridinium, quinolinium, N-$C_1$-$C_4$-alkylquinolinium, N-(phenyl-$C_1$-$C_3$-alkyl)-quinolinium, isoquinolinium, N-$C_1$-$C_4$-

TABLE 3

| Example | $R^1$ | $R^2$ | $R^3$ | $R^4$ | $H^m\oplus^{(1)}$ | k | n | Elemental analysis C [%] | H [%] | N [%] | Decomposition point [°C.] | Yield [% of theory] | Conductivity δ[S·cm⁻¹] |
|---|---|---|---|---|---|---|---|---|---|---|---|---|---|
| 18 | H | H | H | H | Ag⊕ | 1 | 1 | 36.41 | 1.38 | 21.04 | from 270 | 8 | |
| 19 | CH₃ | CH₃ | H | H | Ag⊕ | 1 | 1 | 41.24 | 2.61 | 19.29 | from 205 | 8 | |
| 20 | CH₃ | H | CH₃ | H | Ag⊕ | 2 | 1 | 50.42 | 3.29 | 22.91 | 205 | 10 | 18 |
| 21 | CH₃ | H | Cl | H | Ag⊕ | 2 | 1 | 41.41 | 1.88 | 21.41 | from 207 | 38 | |
| 22 | Cl | H | Cl | H | Ag⊕ | 1.7 | 1 | 33.25 | 0.20 | 19.70 | from 305 | 24 | |
| 23 | Br | H | Br | H | Ag⊕ | 3 | 2 | 25.03 | 1.06 | 14.35 | >350 | 15 | |
| 24 | Cl | H | Cl | H | THA⊕ | 2 | 1 | 46.37 | 3.10 | 23.95 | from 220 | 25 | 2·10⁻² |
| 25 | Br | H | Br | H | THA⊕ | 3 | 2 | 35.82 | 2.89 | 17.43 | from 205 | 6 | |
| 26 | Cl | H | Cl | H | NHQ⊕ | 1.7 | 1 | 54.13 | 2.30 | 20.68 | from 217 | 45 | 0.1 |
| 27 | Br | H | Br | H | NHQ⊕ | 5 | 4 | 45.01 | 2.23 | 15.36 | 198 | 19 | |
| 28 | Br | H | Br | H | NHQ⊕ | 3 | 2 | 42.67 | 2.02 | 16.09 | from 218 | 43 | |
| 29 | Cl | H | Cl | H | Q⊕ | 1 | 1 | 57.16 | 2.81 | 20.11 | from 126 | 25 | |
| 30 | H | H | H | H | NMP⊕ | 2 | 1 | 68.53 | 3.89 | 27.25 | 125 | 8 | |
| 31 | Cl | H | Cl | H | NHP⊕ | 1 | 1 | 60.67 | 3.09 | 19.83 | 149 | 26 | |
| 32 | Br | H | Br | H | NHP⊕ | 1 | 1 | 47.10 | 2.47 | 15.85 | from 121 | 7 | |
| 33 | CH₃ | H | Br | H | Ag⊕ | 2 | 1 | 35.85 | 1.68 | 18.94 | >350 | 45 | |
| 34 | —(CH₂)₄— | | H | H | Cu⊕ | 5 | 4 | 55.11 | 3.73 | 21.84 | >350 | 58 | |
| 35 | Cl | H | Cl | H | Cu⊕ | 1 | 1 | 32.59 | 0.73 | 18.83 | >350 | 22 | 0.08⁽¹⁾ |
| 36 | —(CH=CH)₂— | | Cl | Cl | Ag⊕ | 1 | 1 | 36.89 | 1.02 | 14.21 | >350 | 38 | 0.02⁽¹⁾ |
| 37 | OCH₃ | H | OCH₃ | H | Cu⊕ | 1 | 1 | 44.35 | 3.10 | 20.43 | >350 | 22 | 0.7⁽¹⁾ |
| 38 | H | H | H | H | Cu⊕ | 1 | 1 | 43.24 | 1.85 | 25.59 | >270 | 52 | 0.02⁽¹⁾ |
| 39 | CH₃ | H | Cl | H | Cu⊕ | 2 | 1 | 41.81 | 1.95 | 21.67 | >350 | 46 | 300⁽²⁾ 0.4⁽¹⁾ |
| 40 | CH₃ | H | Br | H | Cu⊕ | 2 | 1 | 37.88 | 1.80 | 19.72 | >350 | 86 | 0.3⁽¹⁾ |

⁽¹⁾TMA⊕ = tetramethylammonium, NMQ⊕ = N—methylquinolinium, Q⊕ = quinolinium, NMP⊕ = N—methylphenazinium ⁽¹⁾measured on microcrystalline powder
⁽²⁾measured on the single crystal alkylisoquinolium, N-(phenyl-$C_1$-$C_3$-alkyl)-isoquinolinium, phenazinium, N-$C_1$-$C_4$-alkyl-phenazinium or N-(phenyl-$C_1$-$C_3$-alkyl)-phenazinium; and wherein k is from 1 to 5, l is from 0.1 to 4, m is from 1 to 3, n is from 0.1 to 4, x is from 0 to 2 and y is from 0 to 6, or k, l, n, x and y are non-integral numbers wherein the number of negative charges on the radical

We claim:
1. A radical ion salt of the formula:

(1⁻) plus the number of iodine anions (x) is equal to the number of metal cations multiplied by the number of positive charges per metal cation, thereby ensuring that the radical ion salt is neutral.

2. The radical ion salt as claimed in claim 1, wherein said substituted fused aromatic rings are mono- or disubstituted by chlorine, bromine, methyl or methoxy.

3. A radical ion salt of the formula:

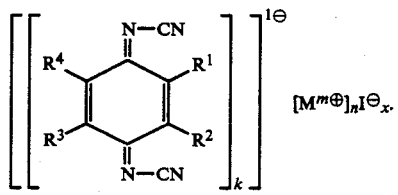

where $R^1$ and $R^3$ are each hydrogen, methyl, methoxy, chlorine or bromine; $R^2$ is hydrogen or methyl and $R^4$ is hydrogen; or $R^1$ and $R^2$ together are of the formula:

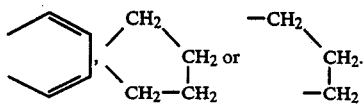

and wherein $M^{m+}$ is a copper or silver ion or pyridinium, N-methylpyridinium, quinolinium, N-methylquinolinium, phenazinium or N-methylphenazinium, k is from 1 to 5, l is from 0.1 to 4, m is from 1 to 3, n is from 0.1 to 4, x is from 0 to 2, or k, l, n and x are non-integral numbers and, wherein the number of negative charges on the radical ion (1⁻) plus the number of iodine anions (x) is equal to the number of metal cations multiplied by the number of positive charges per metal cation, thereby ensuring that the radical ion salt is neutral.

4. The radical ion salt as claimed in claim 1, wherein $M^{m\oplus}$ is a copper(I) or silver ion or tetramethylammonium, tetraethylbenzylammonium, tetrabenzylammonium, trimethylbenzylammonium, triethylammonium, quinolinium, pyridinium, N-methylpyridinium, N-ethylquinolinium, N-methylquinolinium, phenazinium or N-methylphenazinium.

5. The radical ion salt of the formula according to claim 1, wherein $M^{m\oplus}$ is a copper(I) or silver ion or pyridinium, N-methylpyridinium, quinolinium, N-methylquinolinium, phenazinium or N-methylphenazinium.

6. The radical ion salt as claimed in claim 1, wherein $R^1$, $R^2$, $R^3$ and $R^4$ are each hydrogen, fluorine, chlorine, methyl or methoxy or $R^1$ is chlorine, bromine, methyl, ethyl, methoxy, ethoxy, phenyl or tert-butyl and $R^2$, $R^3$ and $R^4$ are each hydrogen, or $R^1$ and $R^4$ are each chlorine, methyl or methoxy and $R^2$ and $R^3$ are each hydrogen, or $R^1$ and $R^2$ are each chlorine, methyl, methoxy or phenyl and $R^3$ and $R^4$ are each hydrogen, or $R^1$ and $R^3$ are each chlorine, bromine, methyl, ethyl, methoxy, phenyl or tert-butyl and $R^2$ and $R^4$ are each hydrogen, or $R^1$, $R^2$ and $R^3$ are each methyl and $R^4$ is hydrogen, or $R^1$ is methyl, $R^3$ is chlorine or bromine and $R^2$ and $R^4$ are each hydrogen, or $R^1$ and $R^2$ together form a radical of the formula:

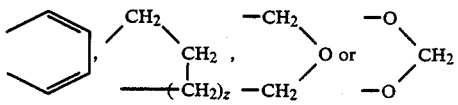

where z is 1 or 2, and the fused benzene ring is unsubstituted or monosubstituted or disubstituted by chlorine, methyl or methoxy, and $R^3$ and $R^4$ independently of one another are each hydrogen, chlorine or methyl.

7. The radical ion salt as claimed in claim 1, wherein $R^1$, $R^2$, $R^3$ and $R^4$ are each hydrogen, fluorine, chlorine, methyl or methoxy or $R^1$ is chlorine, bromine, methyl, ethyl, methoxy, ethoxy, phenyl or tert-butyl and $R^2$, $R^3$ and $R^4$ are each hydrogen, or $R^1$ and $R^4$ are each chlorine, methyl or methoxy and $R^2$ and $R^3$ are each hydrogen, or $R^1$ and $R^2$ are each chlorine, methyl, methoxy or phenyl and $R^3$ and $R^4$ are each hydrogen, or $R^1$ and $R^3$ are each chlorine, bromine, methyl, ethyl, methoxy, phenyl or tert-butyl and $R^2$ and $R^4$ are each hydrogen, or $R^1$, $R^2$ and $R^3$ are each methyl and $R^4$ is hydrogen, or $R^1$ is methyl, $R^3$ is chlorine or bromine and $R^2$ and $R^4$ are each hydrogen, or $R^1$ and $R^2$ together form a radical of the formula

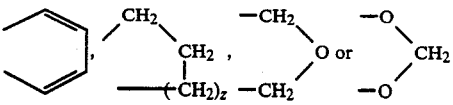

where z is 1 or 2, and the fused benzene ring is unsubstitued or monosubstituted or disubstituted by chlorine, methyl or methoxy, and $R^3$ and $R^4$ independently of one another are each hydrogen, chlorine or methyl.

8. The radical ion salt as claimed in claim 1, wherein $R^1$, $R^2$, $R^3$ and $R^4$ are each hydrogen, fluorine, chlorine, methyl or methoxy, or $R^1$ is chlorine, bromine, methyl, ethyl, methoxy, ethoxy, phenyl or tert-butyl and $R^2$, $R^3$ and $R^4$ are each hydrogen, or $R^1$ and $R^4$ are each chlorine, methyl or methoxy and $R^2$ and $R^3$ are each hydrogen, or $R^1$ and $R^2$ are each chlorine, methyl, methoxy or phenyl and $R^3$ and $R^4$ are each hydrogen, or $R^1$ and $R^3$ are each chlorine, bromine, methyl, ethyl, methoxy, phenyl or tert-butyl and $R^2$ and $R^4$ are each hydrogen, or $R^1$, $R^2$ and $R^3$ are each methyl and $R^4$ is hydrogen, or $R^1$ is methyl, $R^3$ is chlorine or bromine and $R^2$ and $R^4$ are each hydrogen, or $R^1$ and $R^2$ together form a radical of the formula

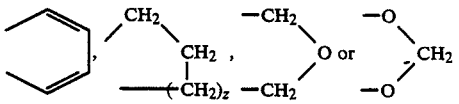

where z is 1 or 2, and the fused benzene ring is unsubstituted or monosubstituted or disubstituted by chlorine, methyl or methoxy, and $R^3$ and $R^4$ independently of one another are each hydrogen, chlorine or methyl.

9. The radical ion salt as claimed in claim 4, wherein $R^1$, $R^2$, $R^3$ and $R^4$ are each hydrogen, fluorine, chlorine, methyl or methoxy, or $R^1$ is chlorine, bromine, methyl, ethyl, methoxy, ethoxy, phenyl or tert-butyl and $R^2$, $R^3$ and $R^4$ are each hydrogen, or $R^1$ and $R^4$ are each chlorine, methyl or methoxy and $R^2$ and $R^3$ are each hydrogen, or $R^1$ and $R^2$ are each chlorine, methyl, methoxy or phenyl and $R^3$ and $R^4$ are each hydrogen, or $R^1$ and $R^3$ are each chlorine, bromine, methyl, ethyl, methoxy, phenyl or tert-butyl and $R^2$ and $R^4$ are each hydrogen, or $R^1$, $R^2$ and $R^3$ are each methyl and $R^4$ is hydrogen, or $R^1$ is methyl, $R^3$ is chlorine or bromine and $R^2$ and $R^4$ are each hydrogen, or $R^1$ and $R^2$ together form a radical of the formula

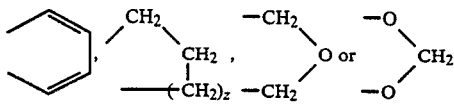

where z is 1 or 2, and the fused benzene ring is unsubstituted or monosubstituted or disubstituted by chlorine, methyl or methoxy, and $R^3$ and $R^4$ independently of one another are each hydrogen, chlorine or methyl.

10. The radical ion salt as claimed in claim 5, wherein $R^1$, $R^2$, $R^3$ and $R^4$ are each hydrogen, fluorine, chlorine, methyl or methoxy, or $R^1$ is chlorine, bromine, methyl, ethyl, methoxy, ethoxy, phenyl or tert-butyl and $R^2$, $R^3$ and $R^4$ are each hydrogen, or $R^1$ and $R^4$ are each chlorine, methyl or methoxy and $R^2$ and $R^3$ are each hydrogen, or $R^1$ and $R^2$ are each chlorine, methyl, methoxy or phenyl and $R^3$ and $R^4$ are each hydrogen, or $R^1$ and $R^3$ are each chlorine, bromine, methyl, ethyl, methoxy, phenyl or tert-butyl and $R^2$ and $R^4$ are each hydrogen, or $R^1$, $R^2$ and $R^3$ are each methyl and $R^4$ is hydrogen, or $R^1$ is methyl, $R^3$ is chlorine or bromine and $R^2$ and $R^4$ are each hydrogen, or $R^1$ and $R^2$ together form a radical of the formula

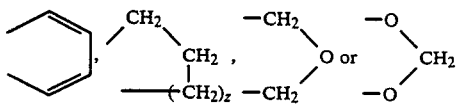

where z is 1 or 2, and the fused benzene ring is unsubstituted or monosubstituted or disubstituted by chlorine, methyl or methoxy, and $R^3$ and $R^4$ independently of one another are each hydrogen, chlorine or methyl.

* * * * *